United States Patent [19]

Butler et al.

[11] Patent Number: 5,450,367
[45] Date of Patent: Sep. 12, 1995

[54] SPLIT SAM WITH INDEPENDENT SAM ACCESS

[75] Inventors: Nicholas D. Butler, Cupernham, United Kingdom; Roderick M. P. West, Colchester, Vt.

[73] Assignee: International Business Machines Corporation, Armonk, N.Y.

[21] Appl. No.: 880,118

[22] Filed: May 7, 1992

[30] Foreign Application Priority Data

May 16, 1991 [EP] European Pat. Off. ............ 91304420

[51] Int. Cl.6 ............................................. G11C 7/00
[52] U.S. Cl. ................... 365/230.05; 365/221; 365/230.09; 365/236
[58] Field of Search ............. 365/189.12, 219, 221, 365/230.04, 230.05, 230.09, 233, 240, 236

[56] References Cited

U.S. PATENT DOCUMENTS

| 4,758,995 | 7/1988 | Sato | 365/230 |
| 4,825,411 | 4/1989 | Hamano | 365/189 |
| 4,855,959 | 8/1989 | Kobayashi | 365/239 |
| 4,862,420 | 8/1989 | Toda et al. | 365/239 X |
| 4,891,794 | 1/1990 | Hush et al. | 365/189.04 |
| 4,984,214 | 1/1991 | Hiltebeitel et al. | 365/230.05 |
| 4,999,814 | 3/1991 | Hashimoto | 365/221 X |
| 5,001,672 | 3/1991 | Ebbers et al. | 365/230.05 |
| 5,040,149 | 8/1991 | Ebihara et al. | 365/230.04 X |
| 5,065,368 | 11/1991 | Gupta et al. | 365/230.05 |
| 5,065,369 | 11/1991 | Toda | 365/230.05 |
| 5,319,603 | 6/1994 | Watanabe et al. | 365/230.05 |

FOREIGN PATENT DOCUMENTS

| 0360243 | 9/1989 | European Pat. Off. . |
| 0361143 | 9/1989 | European Pat. Off. . |
| 2330116 | 11/1976 | France . |

Primary Examiner—Do Hyun Yoo
Attorney, Agent, or Firm—Heslin & Rothenberg

[57] ABSTRACT

Stored data for two different images superimposed on one another can be accessed simply and efficiently from the same VRAM. The SAM of the VRAM is divided into multiple-independent portions, each of which respond to its own independently controlled address counter. By loading the image data access into respective SAM portions, and switching data access between SAM portions at the SAM address rate, superimposed data of two different images can be displayed from the same VRAM.

10 Claims, 3 Drawing Sheets

SPLIT SAM WITH INDEPENDENT SAM ACCESS

BACKGROUND OF THE INVENTION

1. Technical Field

The present invention relates to a memory device capable of high speed data transfer to a peripheral device such as a raster display. Such memories are commonly known as Video Random Access memories (VRAMs).

2. Background Art

VRAMs are commonly used as display memories in display systems. A VRAM is essentially a conventional DRAM with the addition of a second port where memory data can be accessed serially. A conventional VRAM comprises a RAM array, a serial access memory (SAM) array, address/control logic, and transfer gates. The SAM comprises a plurality of conventional cross-coupled-latches, each of which is connected to the bit lines of the RAM through the transfer gates. Preferably the RAM is made up of a plurality of pairs of folded bit lines, as in U.S. Pat. No. Re. 32,708 (assigned to Hitachi). Each transfer gate has a first drain/source electrode connected to one of the input nodes of a SAM latch. Under the control of address/control logic, transfer gates are selected by activating their respective gate electrodes, such that data from selected folded bit line pairs is loaded into respective SAM latches. The RAM array is connected to the primary (RAM) port of the VRAM and behaves in a manner identical to that of a DRAM. The SAM array, sometimes called the Shift Register, is connected to the secondary (SAM or Serial) port of the VRAM and may be accessed serially under the control of an external asynchronous clock, the Serial Clock. An address counter generates an address in the SAM, such that data is accessed starting at an addressed SAM latch. The counter is then incremented under the control of the serial clock, so that data from SAM latches having logically adjacent addresses is presented at the serial port.

The address/control logic supervises the address multiplexing on the RAM port and provides all the control and global timing functions of the VRAM. The transfer gates allow data to pass between the RAM array and the SAM array, under the control of the address/control logic.

In modern all-points-addressable display systems, an image to be viewed is stored point-by-point as picture element or pixel data in a display memory. VRAMs are used in such display systems because their two ports can be operated independently and asynchronously, except when data must be transferred between the RAM and SAM arrays. The SAM array usually has the memory capacity of one row (i.e. all of the bit line pairs) of the RAM array, and a full row of memory data is transferred between RAM and SAM in a single data transfer access. The RAM portion of the VRAM is used as the display memory to store pixel data to be displayed and the RAM port is used to update this data. The SAM port provides the pixel data to video generation circuitry which enables it to be passed to and displayed on a raster display device such as a cathode ray tube.

The RAM port is generally operated at the frequency of the update hardware which may be, for example, a graphics processor. The SAM port is generally operated at a frequency dictated by the requirements of the display device. Because the data to be rastered onto the display device is obtained from the SAM port, almost all the RAM port bandwidth is available for update of the pixel data in the display memory.

In some VRAMs the SAM array is divided into two parts, where one part can be loaded from one half of a row in the RAM array and the other part can be loaded from the other half of that row or another row. These types of VRAMs are called Split Shift Register VRAMs. Examples of such split shift register VRAMs are described in U.S. Pat. Nos. 4,855,959 and 4,825,411. Transfer cycles to the two parts can be made independently so that one may be loaded while the other is being used to provide serial data at the serial output port. An output status or QSF pin is usually provided to indicate which half of the SAM is being scanned out.

A common requirement for a display system for multimedia applications is to be able to support more than one display "layer" simultaneously. The number of display layers is often two, although it can be greater than two. One display layer typically contains "natural image" data, for example live television, and the other display layer typically contains an overlay of text or graphics. The image layer can be made visible through the overlay layer with various forms of mixing. For each pixel the overlay is examined to determine if it is "transparent" allowing the corresponding image pixel to be displayed, or whether it is opaque and so must itself be displayed. As this test is performed for every pixel individually it is generally necessary to fetch both overlay and image data for every pixel i.e. fetch two pictures simultaneously and switch between the pictures as determined for each pixel.

A problem which arises in the application of VRAM technology to display systems for multimedia applications is that of how to hold more than one display layer in the display memory and display each layer simultaneously on a display device.

One way of doing this would be to hold each layer in a separate VRAM device and use the VRAM serial port of each device to access the layers simultaneously. However, for low resolution screens one large VRAM, e.g. 4 Mbit, would have enough capacity to hold the pixel data for all the display layers. The use of multiple VRAMs would therefore increase the memory cost by a factor of the number of layers. So, it would be advantageous if all the data streams could be fetched from a single VRAM device.

With conventional VRAM designs this cannot be efficiently achieved for the following reasons. In order to obtain data for, for example, two layers held in two buffers in separate areas of a conventional VRAM it is necessary to first use a data transfer cycle to load the SAM for the first layer, then read some data for the first layer from the serial output port. Then a data transfer cycle must be used to load the SAM for the second layer and data for the second layer is read from the serial output port. This sequence must then be repeated.

Each data transfer cycle takes a considerable time compared to the rate at which the pixel data needs to be supplied at the output port and also requires accesses at the RAM port, thus reducing the bandwidth available to update the RAM contents. To minimize the time lost, two large buffers, one for each display layer, must be used so that many serial data words can be read for each data transfer cycle. Data for the two layers can then be taken from the two buffers simultaneously in order to be displayed. These large buffers and the control logic required add to the size and complexity of the display system.

In the split shift register VRAM described in U.S. Pat. No. 5,063,368, entitled "Video RAM Double Buffer Select Control," assigned to IBM, two frame buffers are stored, one in each half of the rows in a single VRAM. One frame buffer is scanned out to the screen while the other is being updated by the graphics or image processor. A select control signal controls which half of the serial access memory presents data to the output port for each serial clock signal. The SAM pointers for both halves are incremented simultaneously, so that when access is switched between SAM halves respective latches having different (n, n+1) addresses are accessed.

SUMMARY OF THE INVENTION

It is thus an object of the present invention to provide a memory architecture that efficiently supports a multi-image display.

It is another object of the present invention to provide a memory architecture that stores and accesses separate data in the same array.

The foregoing and other objects of the present invention are realized by a memory device that comprises a random access memory portion, at least two serial access memory portions, each comprising a plurality of storage locations, each storage location corresponding to a unique address, transfer gates connecting the random access memory portion to the serial access memory portions for carrying out data transfer independently therebetween, a serial output port, at least two address counter means, each coupled to a respective one of the serial access memory portions, for generating an address in the corresponding serial access memory portion and for incrementing that address in response to a clock signal, and selection means operable in response to a selection control signal to select one of the serial access memory portions and to present, at the serial output port, the data stored in the storage location therein corresponding to the address generated in the address counter means corresponding thereto.

In the invention, each display layer is stored in a different part of the RAM portion and transferred to a different one of the serial access memory portions to be clocked out of the serial output port when that serial access portion is selected by the selection means.

The selection means can change the selected one of the serial access portions, in response to the selection control signal, at the rate of the serial clock. It is then only necessary to buffer a single word from each layer in order to have data from all the layers available simultaneously.

In one embodiment of the invention there is a single serial clock input and the selection means directs the serial clock to the address counter corresponding to the selected serial access portion. The address counters are only incremented whilst the serial access portions of the memory to which they correspond are selected. Alternatively, a clock input can be provided for each address counter.

In a preferred embodiment of the invention the number of serial access memory portions is two. This allows the invention to be implemented as an enhancement of a conventional split shift register VRAM. An extra counter is added to allow independent serial operation of the two halves of the SAM. In this case the selection means comprises a means responsive to a selection control signal for switching the serial output between the two halves of the SAM. The selection control signal is a binary signal, one binary state selecting a first one of the serial access portions and the other binary state selecting the other of the serial access portions. A pin is added to allow the selection control signal to be externally applied, thus allowing external control over which half of the SAM is active at any time.

Another feature of the invention is additional transfer gate paths. Either half of the SAM can be loaded from either half of a row in the RAM array, i.e. each half of the SAM can now be loaded from any part of the RAM array. This allows an uneven division of the RAM portion of the memory if for example the image and overlay layers are at different resolutions.

BRIEF DESCRIPTION OF THE DRAWING

The invention will be described below with reference to the accompanying drawings, wherein.

DETAILED DESCRIPTION OF THE INVENTION

Figure 1:
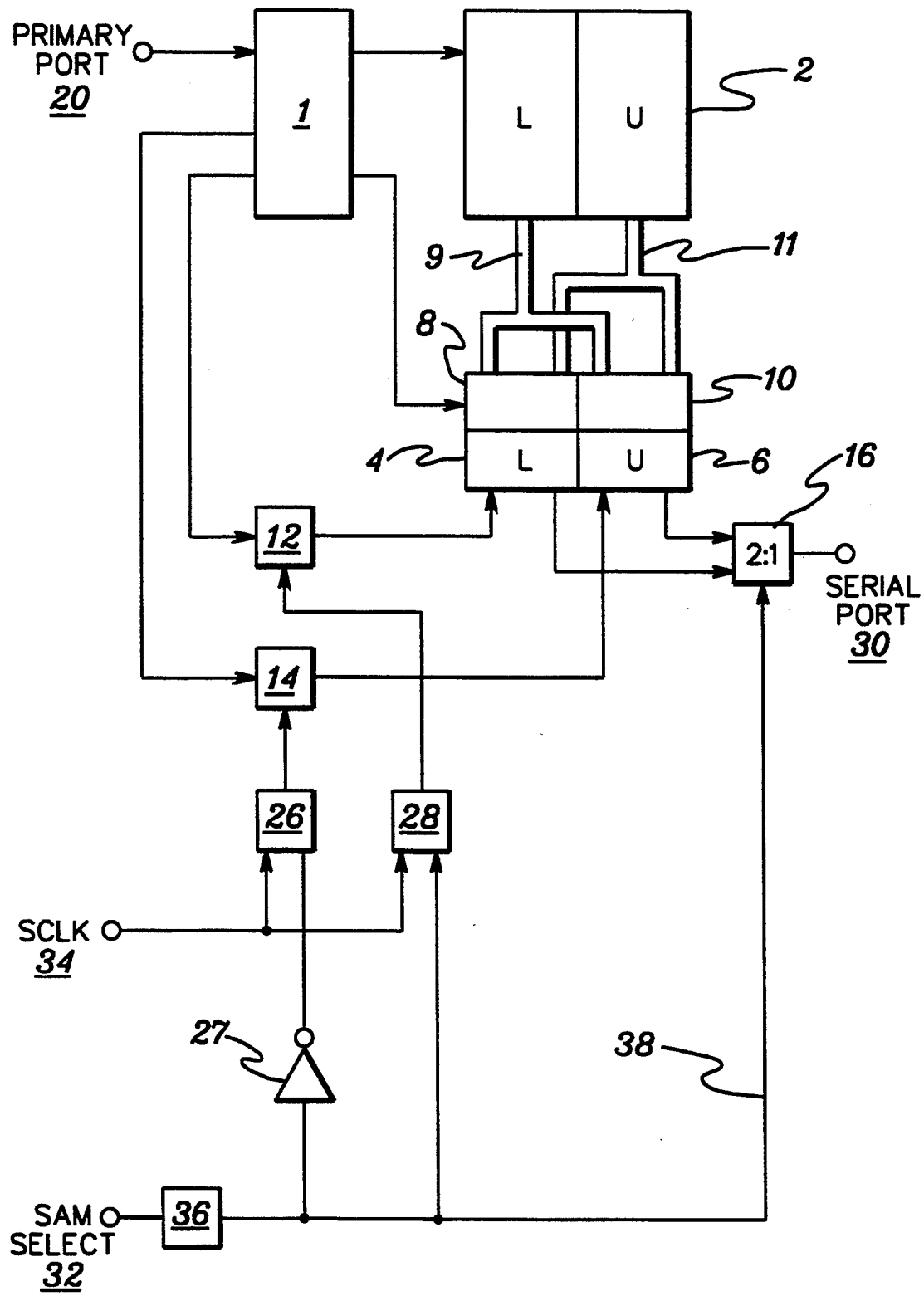
FIG. 1 shows a block diagram of the VRAM according to the present invention.

Referring to FIG. 1 the VRAM comprises a random access portion 2 with memory locations arranged in rows and columns. Data stored in the RAM is loaded via the primary parallel port 20 and address/control logic 1. In this embodiment the VRAM has a capacity of 4 Mb, organized as 256K by 16, with 512 rows by 512 columns by 16 bits. The RAM portion 2 is divided into two halves, an upper half U and a lower half L, each comprising 256 columns. The 512 rows are common to the two halves.

Two serial access memory portions 4, 6, each comprising 256 memory locations and designated the lower L and upper U half of the SAM respectively, are connected to the RAM portion 2 via respective transfer gates 8, 10. The transfer gates enable data to be transferred between the RAM and each half of the SAM over paths 9, 11. Each transfer gate comprises two transistors, each having one controlled electrode coupled to a RAM column, (one in each half of the RAM, at the same logical address) the other controlled electrodes coupled in common to a SAM latch, and gate electrodes receiving respective control signal from the address/control logic 1. In a given SAM loading cycle, the address/control logic 1 will enable one of the two transistors, such that the SAM latch receives data from a column (having the same address) in either the upper or lower halves of the RAM. Thus, each half of the SAM is loadable from the RAM independently under the control of the address/control logic 1 and data from either half of the RAM can be transferred to either half of the SAM.

Each half of the SAM has its own address counter means or tap counter 12, 14. The tap counters receive from the address/control logic 1 an initial address n for a given SAM latch, and generate the address of a memory location n in the corresponding half of the SAM from which data is presented at the serial output port 30. This address is incremented in the tap counters in response to the serial clock signal SCLK 34.

Pipeline latch 36 is connected on a SAM select input 32 and is clocked from serial clock SCLK 34. This reduces the timing constraints on the SAM select input 32 since, if the pipeline latch is included, the signal applied at the selection control input need only be valid for the latch setup and hold times rather than for the whole time data is being read from the output. This allows higher speed serial output port operation.

The outputs from the halves of the SAM are connected via the switch 16 to the serial output port 30. Switch 16 connects the output from one or other of the halves of the SAM to the serial output port depending on the state of the pipelined SAM select line 38. The switch 16 is a two into one multiplexor which operates under the control of the pipelined SAM select line 38.

In addition, the pipelined SAM select line 38 is gated with the single serial clock input 34 via AND gates 26 and 28 and inverter 27 to the two tap counters 12, 14, so that the addresses generated by the tap counters are only incremented whilst the output of the half of the SAM to which they correspond is connected by the switch 16 to the serial output port 30. Thus, the respective SAM halves can be sequentially accessed at SAM latches having addresses.

Figure 2:
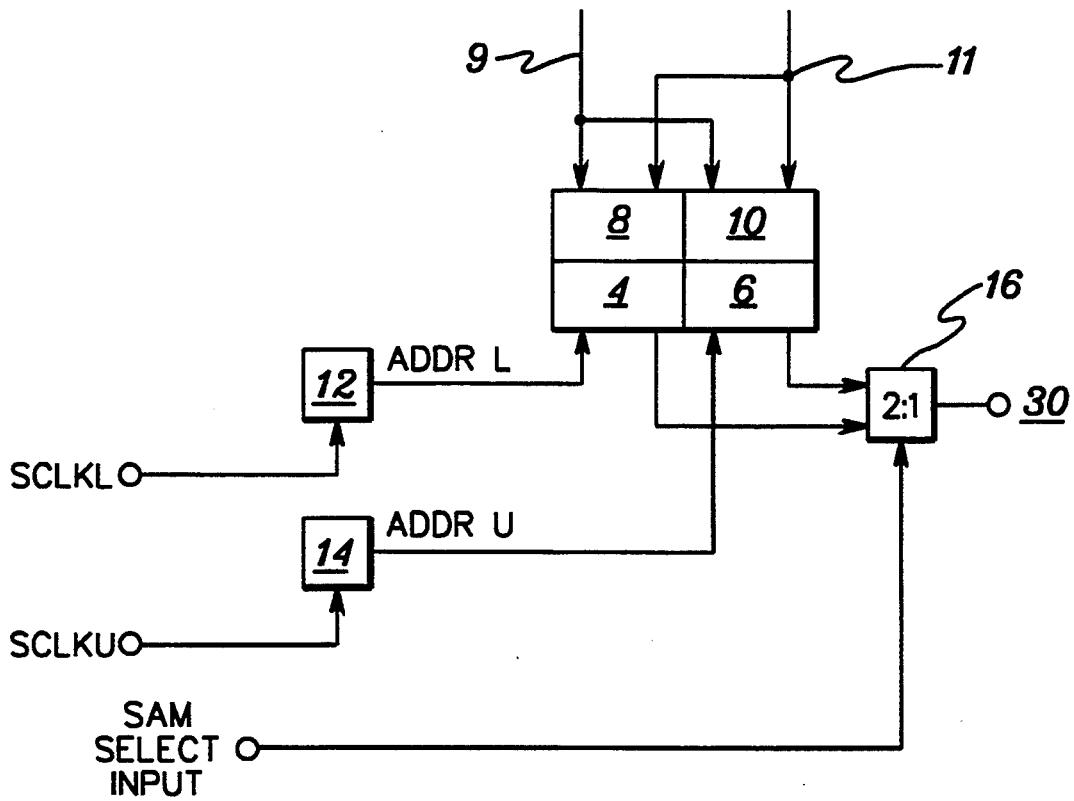
FIG. 2 shows an alternative arrangement of the clock signals to the tap counters.

Alternatively each tap counter can have its own external clock signal. This is illustrated in FIG. 2 where tap counters 12.and 14 have their own clock inputs SCLKU and SCLKL.

Figure 3:
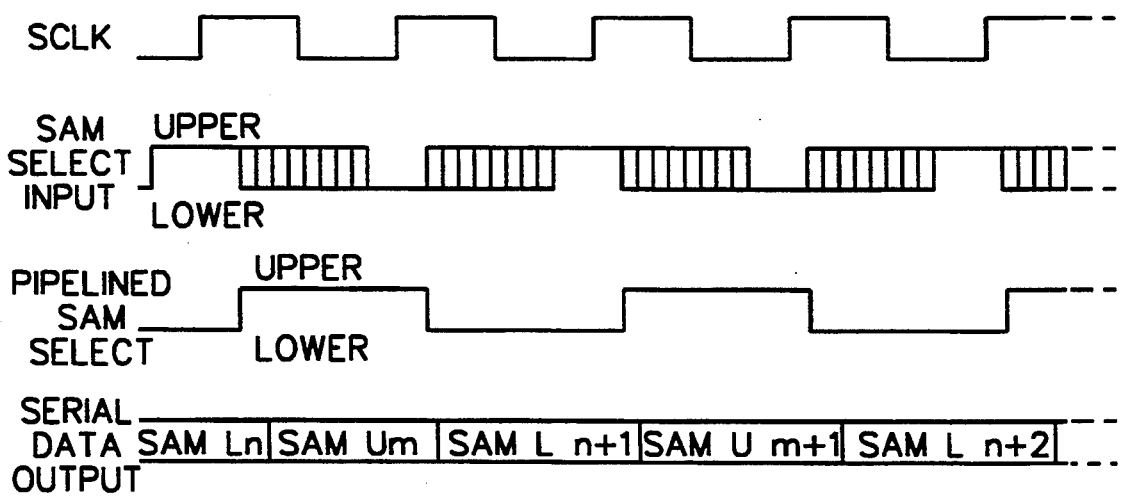
FIG. 3 is a timing diagram showing the data presented at the serial output port and the states of the serial clock and the SAM select line.

FIG. 3 is a timing diagram showing the serial data output and the states of the SAM select line 32, the pipelined SAM select line 38 and the serial clock 34. When the pipelined SAM select line is low, data from the lower half of the SAM is clocked out of the serial output port. When the pipelined SAM select line is high, data from the upper half of the SAM is clocked out of the serial output port.

Data from one display layer is loaded from the L portion of RAM 2 into the lower half of the SAM by turning on transfer gates 8, using one Data Transfer cycle, and data from the other display layer from the U portion of RAM 2 is loaded into the upper half of the SAM by turning on transfer gates 10, using a second Data Transfer cycle. In the example shown in FIG. 3, the serial access portion 4, 6 from which data is being presented at the serial output port is switched at the rate of the serial clock, and so data is obtained alternately from one 256-bit word from each image layer. In this case only one word of data needs to be buffered externally in order that both the image layer and the overlay layer be available simultaneously. So, with SAM SELECT 38 low a data bit from the SAM latch having an address n from SAM portion 4 is passed to the serial output 30. Then when the SELECT signal rises a data bit from the SAM latch having an address n from SAM portion 6 is presented. Then, when the SELECT signal again falls, a data bit from the SAM latch having an address n+1 from SAM portion 4 is output. By providing each SAM portion with its own tap pointer that can be independently set, and by multiplexing the SAM outputs, multiple images can be output at the same time from a single VRAM, without intervening RAM-SAM transfer cycles.

The significance of the independent control of the SAM pointers will now be shown by way of an example. In the prior art, because the pointers for each SAM are commonly controlled, and incremented by the serial clock, in switching between SAM halves sequential latches are accessed. In the prior art, after accessing a latch having address n in the lower SAM half, in switching to the upper SAM half the latch having address n+1 would be accessed. In the invention, latches having the same address n can be sequentially accessed in both SAM halves, which is key to efficiently displaying multiple images. Also, in the prior art in split register VRAMs, accesses between SAM halves are only switched once per each accessed RAM row, because as the upper half of a row is read out of one SAM half the lower half of the row is being loaded into the other SAM half. In the invention accesses between SAM halves switch multiple times for each RAM row; in most applications access would be switched between the two SAM halves every serial clock cycle.

If the pipeline latch were not included the SAM select input 32 would need to be identical to the pipelined SAM select input 38 shown in FIG. 3.

It is not necessary to switch between the two halves of the SAM on every Serial Clock cycle. An application using this VRAM can switch between the two layers whenever appropriate, for example, if the data rate required is different for the two layers due for example to differing number of bits per pixel in each layer. In the invention multiple images can be simultaneously displayed by repeatedly switching whenever appropriate between SAM halves at the frequency of the serial clock, and having separate taps for each SAM half that can be independently controlled, so as to sequentially access non-sequential addresses between respective SAM halves, for example, by sequentially accessing a latch having address n in the lower SAM half and a latch having address n or m in the upper SAM half.

Figure 4:
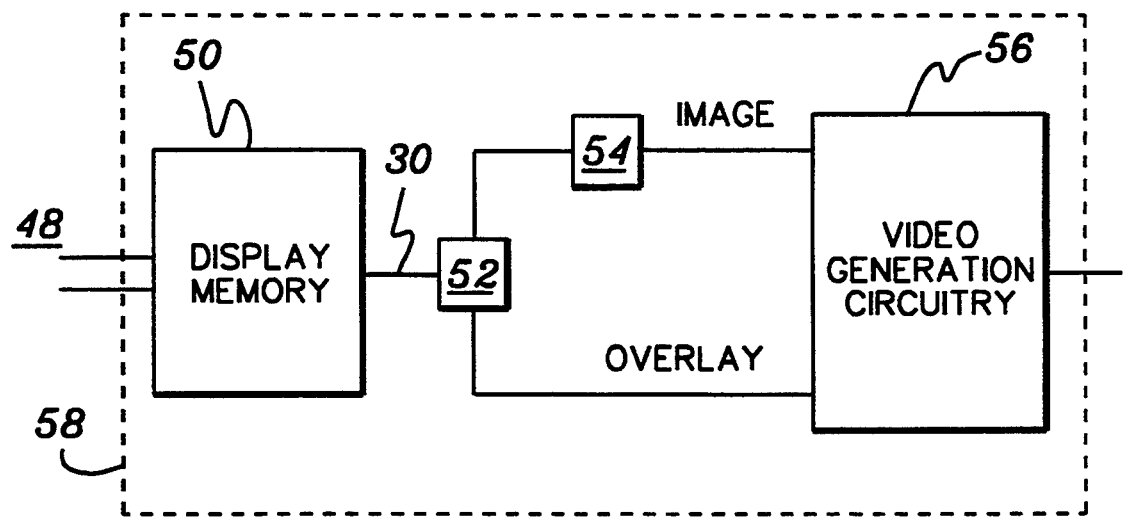
FIG. 4 is a schematic block diagram of a display adapter for use in a multi-media display system in accordance with the invention.

A memory in accordance with the invention can be used as the display memory in a multi-media display system, which can be in the form of a plug-in adapter card for use with a conventional data processing system. Such an adapter 58 is illustrated in FIG. 4. It comprises display memory 50 in which pixel data for the two layers is stored. The pixel data is updated via input port 48. The serial output port 30 of the memory is connected to a multiplexer 52 which passes the image data to buffer 54 and passes the overlay data directly to the video generation circuitry 56. Buffer 54 temporarily stores pixel data from the image layer and then passes it to video generation circuitry 56. Buffer 54 buffers one word of the image data so that the image data, and the overlay data are available to the video generation circuitry simultaneously. The video generation circuitry determines on a pixel-by-pixel basis whether the image layer or the overlay layer is to be displayed, and generates a video signal suitable for output to a display device such as a CRT, enabling a composite image comprised of the image data and the overlay data to be displayed.

Figure 5:
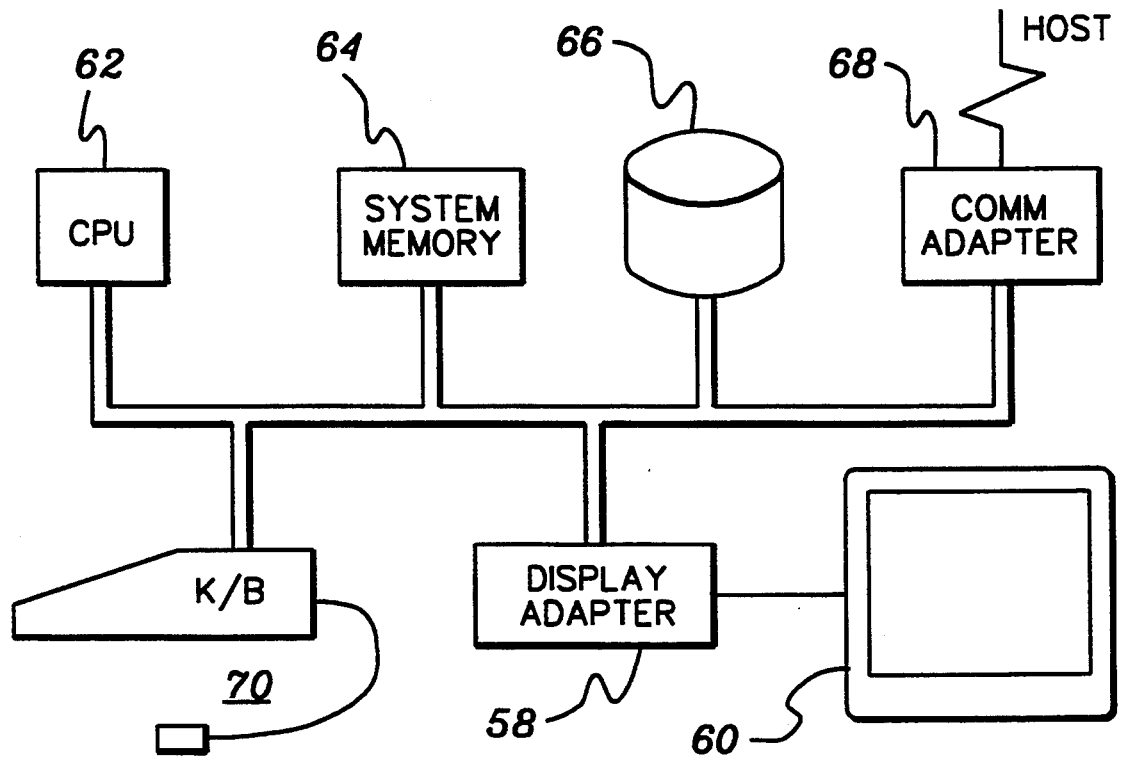
FIG. 5 is a schematic block diagram of a multi-media display system in accordance with the invention.

FIG. 5 shows a multi-media display system, including the display adapter 58. The display system is a conventional computer workstation (comprising a display device 60, a central processing unit 62, a system memory 64, a disk storage device 66 and user input devices 70, such as a keyboard and a mouse) specially adapted for multi-media applications using the display adaptor 58 as described in FIG. 4. The display system is connected to a host computer system (e.g. a network server for a local area network) via a communications adaptor 68. So, for example, the image data could be passed to the display system from the host via the communications adapter under the control of appropriate software and stored in the display memory in adaptor 58. The overlay layer could be generated in the workstation using appropriate software and stored in the display memory in adaptor 58. A composite image comprising the image layer with the graphics overlayed on it can be displayed on the display device.

While the invention has been described with reference to particular embodiments, various modifications may be made to such embodiments without departing from the spirit or scope of the present invention. For example, the RAM could store three or more display images, and the SAM could be broken up into three or more portions, to support display of three or more display layers as a composite image.

What is claimed is:

1. A memory device comprising:
   a random access memory having at least two portions;
   at least two serial access memory portions, each of which having a plurality of storage locations, each storage location corresponding to a unique address;
   transfer gates connecting each random access memory portion to a respective one of said at least two serial access memory portions for carrying out data transfers therebetween;
   a serial output port;
   at least two address counter means, each coupled to a respective one of said at least two serial access memory portions, and each generating an address independent of the other for one of said plurality of storage locations in the corresponding serial access memory portion and incrementing that address in response to a clock signal; and
   selection means operable in response to a selection control signal to select one of said at least two serial access memory portions and to present, at the serial output port, the data stored in said one of said plurality of storage locations corresponding to the address generated in the address counter means corresponding thereto.

2. A memory device as claimed in claim 1 wherein the selection means directs a single serial clock input to each address counter means only when the serial access memory portion corresponding thereto is selected.

3. A memory device as claimed in claim 1 wherein each address counter means has a separate serial clock input.

4. The memory device as claimed in claim 1, wherein the random access memory stores at least two different sets of data and wherein each of said random access memory portions store one of said at least two different sets of data.

5. The memory device as claimed in claim 1, wherein said transfer gates are coupled to both of said portions of said random access memory, and wherein said transfer gates receive a control signal to select which of said portions of said random access memory are to provide data to which of said serial access memory portions.

6. A memory device, comprising:
   a RAM; and
   a SAM having first and second portions made up of a plurality of latches each having an address and storing data from said RAM, each of said first and second portions having a separate address counter means, each of said separate address counter means operating independent of one another, so that latches having non-sequential addresses within said first and second portions are accessed for data transmission.

7. The memory device as claimed in claim 6, further comprising a plurality of transfer gates disposed between said RAM and said SAM for transferring data therebetween.

8. The memory device as claimed in claim 7, wherein said RAM comprises first and second portions, and wherein said plurality of transfer gates are coupled to both of said first and second portions of said RAM for transferring data between a selected one of said first and second portions of said RAM and a selected one of said first and second portions of said SAM.

9. The memory device as claimed in claim 6, wherein said address counter means receive a common counter input, and are selectively activated by a control signal.

10. The memory device as claimed in claim 6, wherein said address counter means receive separate counter inputs.

* * * * *